(12) United States Patent
Heckelmann et al.

(10) Patent No.: US 11,374,152 B2
(45) Date of Patent: Jun. 28, 2022

(54) OPTOELECTRONIC SEMICONDUCTOR CHIP

(71) Applicant: OSRAM OLED GmbH, Regensburg (DE)

(72) Inventors: Stefan Heckelmann, Barbing (DE); Andreas Rudolph, Regensburg (DE); Alexander Tonkikh, Wenzenbach (DE)

(73) Assignee: OSRAM OLED GMBH, Regensburg (DE)

( * ) Notice: Subject to any disclaimer, the term of this patent is extended or adjusted under 35 U.S.C. 154(b) by 97 days.

(21) Appl. No.: 17/054,488

(22) PCT Filed: May 3, 2019

(86) PCT No.: PCT/EP2019/061433
§ 371 (c)(1),
(2) Date: Nov. 10, 2020

(87) PCT Pub. No.: WO2019/215049
PCT Pub. Date: Nov. 14, 2019

(65) Prior Publication Data
US 2021/0167251 A1    Jun. 3, 2021

(30) Foreign Application Priority Data
May 11, 2018  (DE) .......................... 102018111324.2

(51) Int. Cl.
*H01L 33/22* (2010.01)
*H01L 33/30* (2010.01)
(Continued)

(52) U.S. Cl.
CPC ............ *H01L 33/382* (2013.01); *H01L 33/22* (2013.01); *H01L 33/30* (2013.01); *H01L 33/46* (2013.01)

(58) Field of Classification Search
CPC ......... H01L 33/46; H01L 33/30; H01L 33/20; H01L 33/382; H01L 33/14; H01L 33/22; H01L 33/38; H01L 33/32; H01L 33/36
See application file for complete search history.

(56) References Cited

U.S. PATENT DOCUMENTS 7,521,724 B2 *   4/2009   Chen .................... H01L 33/486
                                                            438/453
2008/0265265 A1  10/2008  Xiong et al.
(Continued)

FOREIGN PATENT DOCUMENTS

CN       102903802 A    1/2013
DE    102007008524 A1   8/2008
(Continued)

*Primary Examiner* — Savitri Mulpuri
(74) *Attorney, Agent, or Firm* — MH2 Technology Law Group LLP (57) ABSTRACT

Provided is an optoelectronic semiconductor chip including a semiconductor layer sequence in which an active zone for generating radiation is located between a first semiconductor region and a second semiconductor region. A first electrical contact of the semiconductor layer sequence is applied to the first semiconductor region. A second electrical contact is applied to the second semiconductor region. The second electrical contact is located in a trench of the second semiconductor region. The trench is restricted to the second semiconductor region and ends at a distance from the active zone. A distance between a bottom of the trench and the active zone is at most 3 µm.

17 Claims, 4 Drawing Sheets

(51) Int. Cl.
    *H01L 33/46*         (2010.01)
    *H01L 33/38*         (2010.01)

(56) References Cited

U.S. PATENT DOCUMENTS

| | | | |
|---|---|---|---|
| 2011/0024776 A1* | 2/2011 | Kim | F21K 9/23 |
| | | | 257/E33.013 |
| 2012/0001222 A1 | 1/2012 | Moon et al. | |
| 2012/0104359 A1 | 5/2012 | Felker et al. | |
| 2015/0372192 A1 | 12/2015 | Epler | |
| 2016/0111615 A1* | 4/2016 | von Malm | H01L 27/14687 |
| | | | 438/66 |
| 2016/0163929 A1* | 6/2016 | Jeong | H01L 33/38 |
| | | | 257/13 |
| 2017/0092808 A1* | 3/2017 | Perzlmaier | H01L 33/38 |
| 2017/0358707 A1 | 12/2017 | Kharas | |

FOREIGN PATENT DOCUMENTS

| | | |
|---|---|---|
| DE | 102007057756 A1 | 6/2009 |
| DE | 102014107385 A1 | 11/2015 |
| DE | 102015107577 A1 | 11/2016 |
| EP | 2280431 A2 | 2/2011 |
| EP | 2360747 A2 | 8/2011 |
| EP | 2860774 A1 | 4/2015 |

\* cited by examiner

OPTOELECTRONIC SEMICONDUCTOR CHIP

CROSS-REFERENCE TO RELATED APPLICATIONS

This patent application is a national stage entry from International Application No. PCT/EP2019/061433, filed on May 3, 2019, published as International Publication No. WO 2019/215049 A1 on Nov. 14, 2019, and claims priority under 35 U.S.C. § 119 from German patent application 10 2018 111 324.2, filed May 11, 2018, the entire contents of all of which are incorporated by reference herein.

An optoelectronic semiconductor chip is specified.

An object to be solved is to specify an optoelectronic semiconductor chip which has a high light extraction efficiency.

This object is solved, inter alia, by an optoelectronic semiconductor chip with the features of the independent claim. Preferred further developments are subject of the dependent claims.

According to at least one embodiment, the optoelectronic semiconductor chip is configured to generate radiation, in particular near-ultraviolet radiation, visible light or near-infrared radiation. For example, a wavelength of maximum intensity of the radiation generated by the semiconductor chip during operation is at least 360 nm or 420 nm, in particular at least 560 nm. Alternatively or additionally, the maximum intensity wavelength is at most 1300 nm or 950 nm or 820 nm. The semiconductor chip is preferably a light emitting diode chip, or LED chip for short.

According to at least one embodiment, the semiconductor chip comprises a semiconductor layer sequence. In the semiconductor layer sequence there is an active zone for radiation generation. The active zone contains in particular a single quantum well structure, a multiple quantum well structure and/or at least one pn junction.

The semiconductor layer sequence is preferably based on a III-V compound semiconductor material. The semiconductor material is for example a nitride compound semiconductor material such as $Al_nIn_{1-n-m}Ga_mN$ or a phosphide compound semiconductor material such as $Al_nIn_{1-n-m}Ga_mP$ or an arsenide compound semiconductor material such as $Al_nIn_{1-n-m}Ga_mAs$ or such as $Al_nGa_mIn_{1-n-m}As_kP_{1-k}$, where $0 \leq n \leq 1$, $0 \leq m \leq 1$ and $n+m \leq 1$ and $0 \leq k < 1$ respectively. Preferably for at least one layer or for all layers of the semiconductor layer sequence $0 < n \leq 0.8$, $0.4 \leq m < 1$ and $n+m \leq 0.95$ as well as $0 < k \leq 0.5$. The semiconductor layer sequence may contain dopants as well as additional components. For the sake of simplicity, however, only the essential constituents of the crystal lattice of the semiconductor layer sequence, i.e. Al, As, Ga, In, N or P, are given, even if these may be partially replaced and/or supplemented by small amounts of other substances.

Preferably the semiconductor layer sequence is based on the material system AlInGaAs or AlInGaAsP.

According to at least one embodiment, the semiconductor layer sequence comprises a first semiconductor region and a second semiconductor region. The active zone is located between the two semiconductor regions, especially along a growth direction of the semiconductor layer sequence. Each of the semiconductor regions can be formed from a single semiconductor layer or alternatively comprise several semiconductor layer sequences. The first semiconductor region is in particular p-doped and the second semiconductor region is correspondingly n-doped. Alternatively, the semiconductor regions are doped in exactly the opposite way.

According to at least one embodiment, the semiconductor chip comprises a first electrical contact of the semiconductor layer sequence. The first electrical contact is located at the first semiconductor region and is configured for current injection into the first semiconductor region. Thus the first electrical contact touches the first semiconductor region at least in places.

According to at least one embodiment, the semiconductor chip comprises a second electrical contact of the semiconductor layer sequence. The second electrical contact is located at the second semiconductor region and touches the second semiconductor region at least in places. Via the second electrical contact, current is injected into the second semiconductor region, in particular only via the second electrical contact.

According to at least one embodiment, the second electrical contact is partially or completely located in a trench. The trench is formed in the second semiconductor region and limited to the second semiconductor region. In particular, the trench does not touch the active zone. However, the trench ends close to the active zone. This means in particular that a distance between a bottom of the trench and the active zone is at most 3 µm, preferably at most 2 µm, particularly preferably at most 1 µm, in particular between 0.3 µm and 0.8 µm inclusive.

In at least one embodiment, the optoelectronic semiconductor chip comprises a semiconductor layer sequence in which an active zone for generating radiation is located between a first semiconductor region and a second semiconductor region. A first electrical contact of the semiconductor layer sequence is located at the first semiconductor region. A second electrical contact of the semiconductor layer sequence is located at the second semiconductor region. The second electrical contact is at least partially located in a trench of the second semiconductor region. The trench is limited to the second semiconductor region and ends at a distance from the active zone. A distance between a bottom of the trench and the active zone is at most 3 µm, preferably at most 1 µm.

At a light-emitting side of a semiconductor layer sequence of a thin-film LED, i.e. an LED in which a growth substrate has been removed from a semiconductor layer sequence, metallic contact ridges are usually applied to a surface in order to establish an electrical connection to the semiconductor material. If the light generated in deeper layers of the semiconductor layer sequence hits a contact-semiconductor boundary, only part of this light is reflected and the rest is absorbed. While the absorbed light is to be considered a loss, the reflected light can still escape from the semiconductor chip elsewhere.

The reflected portion of the light striking the contact depends on the choice of the material of the electrical contact and the angle of incidence of the light on this interface. The flatter the angle of incidence, the higher is usually the reflected portion. Since most of the light is not generated directly below the contact, but in areas to the side of it, a flatter average angle of incidence on the semiconductor-contact interface can be achieved by reducing the distance between the active zone and a semiconductor surface.

However, in the semiconductor layers between the light-generating layers and the semiconductor surface, there is conduction of current in transverse direction away from the contact. If this distance and thus a thickness of the transversely conducting layers is reduced, this also increases the sheet resistance of the second semiconductor region and thus the necessary operating voltage of the LED chip for a defined current flow, resulting in reduced efficiency.

Possible other contacting schemes involve applying a metal-semiconductor contact directly to a flat semiconductor surface and alloying it in if necessary. Alternatively, the semiconductor layers on the upper side of the LED chip are contacted from a back side via via contacts. A further alternative is the use of transparent conductive materials for contacting on the light-emitting side. However, such materials applied in areal manner contribute significantly to the absorption of radiation if their electrical transverse conductivity is sufficiently high.

In the semiconductor chip described here, the semiconductor layer sequence is deepened below and in a preferably narrow region around the second electrical contact, and the second electrical contact is applied in the depression, i.e. in the trench, and preferably alloyed in.

In this way, a small distance between the second contact and the active zone can be set independently of the thickness of the transverse conductive layer. The thinner transverse conducting layer in the area of the electrical contact increases the sheet resistance much less than a reduction in thickness over the entire surface. At the same time, the average angle of incidence becomes smaller, so that the generated radiation hits the semiconductor-contact interface at a flatter angle, thus reducing absorption losses. This allows the semiconductor chip to emit a larger proportion of the generated radiation.

According to at least one embodiment, the trench has side walls. The side walls preferably extend from the bottom of the trench to an upper side of the second semiconductor region facing away from the active zone. The side walls can be straight or curved in cross-section.

According to at least one embodiment, the side walls of the trench are free from the second electrical contact. A distance of the second electrical contact from the side walls is preferably at least 0.5 µm or 1 µm or 2 µm. Thus the side walls preferably do not touch the second electrical contact.

According to at least one embodiment, a center angle between an underside of the second electrical contact and a radiation-generating region of the active zone is at least 1 mrad or 2 mrad or 5 mrad. Alternatively or additionally, the angle at the centre is at most 0.6 rad or 0.2 rad or 80 mrad or 50 mrad. The radiation-generating regions are regions of the active zone which are energized when the semiconductor chip is used as intended.

In particular, the tangent of the center angle A defined as the quotient of the distance D of the underside of the second electrical contact from the active zone and half the distance W between adjacent second electrical contacts:
tan $A=D/(0.5\ W)$. The distance W refers to the distance between the centre lines of the respective second electrical contacts, seen in top view. For example, a distance D of 1 µm and a distance W between strips of the second contact of 100 µm results in a center angle $A \approx \tan A = 1$ µm/50 µm=20 mrad.

For example, if the second contact is designed as a hexagonal grid, the distance W is preferably equal to one mesh width. If the second contact is a contact structure that diverges at an angle to one another and/or diverges divergently, for example star-shaped or V-shaped, the distance W can be based on an average distance between adjacent structural units of the second contact.

According to at least one embodiment, the second electrical contact is completely located in the assigned trench in at least one cross-section perpendicular to the trench. Preferably, this applies to a predominant part of the second electrical contact, for example at least 50% or 70% or 90% along a longitudinal direction of the second electrical contact.

According to at least one embodiment, a ratio of a length to a width of the second electrical contact is at least 10 or 15 or 25 or 50 in top view. In other words, the second electrical contact is considerably longer than it is wide in top view. For example, the second electrical contact is designed as a web-shaped, finger-shaped, hexagonal and/or branched structure, so that, for example, starting from an electrical contact surface for a bonding wire, a current spreading can take place across the semiconductor layer sequence.

In accordance with at least one embodiment, the second electrical contact protrudes in at least one cross-section, viewed perpendicularly to the trench, beyond the associated trench in the direction away from the bottom. In other words, the second electrical contact is then thicker and/or higher than the trench is deep. This applies, for example, to a proportion of at least 15% or 40% or 80% of the second electrical contact when viewed along a longitudinal direction of the second electrical contact and/or to at most 90% or 50% or 25%.

According to at least one embodiment, the bottom of the trench is predominantly covered by the second electrical contact, in particular directly covered. Predominantly means, in particular, an area proportion of at least 50% or 70% or 85%.

According to at least one embodiment, at least one recess is formed in the first semiconductor region, so that the first semiconductor region is partially removed. Preferably several recesses are present. In other words, the recess or recesses represent thinner areas of the first semiconductor region.

According to at least one embodiment, the recess is at a distance from the active zone. This means that the active zone is not affected by the recess. A distance between the active zone and the at least one recess is preferably at least 100 nm or 200 nm or 300 nm and alternatively or additionally at most 1 µm or 0.5 µm.

According to at least one embodiment, the recess and the trench are opposite each other with respect to the active zone. In other words, the recess, the active zone and the trench preferably follow each other along the growth direction of the semiconductor layer sequence and/or in the direction perpendicular to the active zone. In top view, the recess and the trench thus overlap partially or, preferably, completely. The recess and the trench can be arranged centrally to one another so that the center lines of the recess and the trench can be congruent when viewed from above on the upper side. If the recess and the trench only partially overlap, the trench may be partially next to the recess in top view of the upper side. Preferably, the trench width is smaller than the recess width, although the reverse may also apply, or the widths may be the same.

According to at least one embodiment, the first contact covers the first semiconductor region in areal manner. This means, for example, that at least 60% or 75% or 90% or 95% of the back side of the first semiconductor region is covered by the first contact and preferably also electrically contacted.

According to at least one embodiment, the first contact is located exclusively next to the second semiconductor region when viewed from above. Thus, the first and second contacts do not overlap when viewed from above on the upper side and/or the back side.

According to at least one embodiment, a distance between the first and the second contact in top view on the upper side and/or on the back side is at most 70% or 50% or 40% or 40% or 20% or 10% of an average width of the second contact. Alternatively or additionally, this distance is at least 1% or 2% or 5% or 10% of the average width of the second contact.

According to least one embodiment, the recess reduces or prevents current flow to the active zone in the area of the trench. Due to the material removal of the first semiconductor region, there is no significant electrical transverse conduction in the first semiconductor region in the area of the recess. Thus, the active zone in the area of the trench is not or not significantly energized from the first semiconductor region. In particular, an average current intensity of the active zone in the area of the trench is at least a factor of 5 or 10 or 20 lower than an average current intensity in the areas of the active zone intended for radiation generation, which are preferably located next to the trench when viewed from above.

It is possible that recesses are additionally present away from the second contact, which is designed as a contact finger, for example. This means that the structure of the recesses is hexagonal under the contact fingers and between the contact fingers, for example, and not just under the contact fingers.

According to at least one embodiment, the recess is wider than the associated trench. In particular, the recess overhangs the trench on both sides when viewed in cross-section. A lateral projection of the recess above the trench, i.e. in the direction parallel to the active zone, is preferably at least 0.5 µm or 1 µm or 2 µm or 5 µm and/or at most 10 µm or 6 µm or 3 µm. The recess preferably reaches closer to the active zone than the trench.

A distance of the trench from the active zone is preferably at least 0.3 µm or 0.5 µm or 0.7 µm. Such a comparatively large distance of the trench from the active zone allows to achieve that an alloying of materials of the second electrical contact into the semiconductor layer sequence does not reach the active zone and thus does not or not significantly affect the active zone.

According to at least one embodiment, the side walls of the trench are partially or completely covered with a mirror layer. The mirror layer is preferably made of an electrically insulating material. The mirror layer can be composed of several partial layers. For example, the mirror layer is made of an oxide such as silicon dioxide or aluminum oxide and/or a nitride such as silicon nitride or aluminum nitride.

According to at least one embodiment, the mirror layer covers at most 40% or 20% or 10% of the bottom of the trench. The bottom can thus be essentially free of the mirror layer. It is possible that the bottom of the trench is completely or at least 90% or 80% directly covered by the second electrical contact together with the mirror layer.

According to at least one embodiment, the side walls of the trench are partially or completely covered with an anti-reflection layer and/or with a roughening to improve light extraction. The anti-reflection layer may be made of the same materials as those used above for the mirror layer. The anti-reflection layer and the mirror layer differ in particular in their thicknesses. For example, the anti-reflective layer has a thickness of approximately $\lambda/4$, whereas the thickness of the mirror layer is preferably approximately $\lambda/2$. $\lambda$ stands for the wavelength of maximum intensity of the radiation generated in the active zone during operation.

According to at least one embodiment, the bottom of the trench is free of the antireflection layer and/or roughening. This means that in the area of the bottom there is preferably no increased light extraction from the semiconductor layer sequence. It is possible that an anti-reflection layer and/or a roughening on an upper side of the semiconductor layer sequence is also applied to the side walls and that the bottom and/or the side walls near the bottom are provided with the mirror layer.

According to at least one embodiment, the side walls of the trench are inclined inwards. This means that an angle between the bottom and the side walls is less than 90°. For example, the angle between the bottom and the side walls is at least 75° or 80° or 85°. Thus, the bottom of the trench may be partially covered by the side walls, seen in top view.

According to at least one embodiment, the side walls are inclined outwards so that an angle between the side walls and the bottom is more than 90°. For example, this angle is at least 95° or 100° and/or at most 135° or 125° or 115°.

According to at least one embodiment, the second electrical contact is trapezoidal or approximately trapezoidal in cross-section. Alternatively or additionally, a width of the second electrical contact may steadily decrease in the direction away from the bottom of the trench. The second electrical contact is preferably symmetrical to a growth direction of the semiconductor layer sequence, seen in cross-section. As an alternative to a trapezoid, the second electrical contact can also be triangular or cuboid or square in cross-section.

According to at least one embodiment, the second electrical contact is configured for current distribution in a direction parallel to the active zone. The second electrical contact is preferably a branched or grid-like structure across the semiconductor layer sequence when viewed from above. The second electrical contact runs, for example, in a branch-like manner away from an electrical contact area such as a bond pad for a bonding wire. Alternatively, the second electrical contact can also be formed by closed grid lines.

According to at least one embodiment, the first electrical contact is formed with a plurality of point-like current injection areas towards the first semiconductor region. Point-shaped means, for example, that an average diameter of the current injection areas is at most 0.5% or 1% or 2% of an average edge length of the semiconductor chip and/or at most 5 µm or 10 µm or 20 µm. Thereby it may be achieved that the first electrical contact only touches the first semiconductor region to an area proportion of preferably at most 20% or 10% or 5%. This allows absorption losses of the generated radiation at the first electrical contact to be reduced. The mean edge length is, for example, at least 0.1 mm or 0.3 mm or 0.6 mm and/or at most 3 mm or 1.5 mm.

According to at least one embodiment, the active zone extends continuously and/or in areal manner and/or flat over the semiconductor layer sequence. Thus, the active zone is interrupted neither by the trenches nor by the recesses and can be continuous and contiguous under the trenches. In this case, the active zone is not structured, unlike the first and/or second semiconductor region, for example.

According to at least one embodiment, the first semiconductor region and/or the second semiconductor region comprises an etch stop layer. The trench and/or the recess ends at the respectively assigned etch stop layer. Thus the active zone can be protected efficiently when creating the trench and/or recess.

If the assigned semiconductor region is made of an arsenide, the etch stop layer is preferably made of a phosphide, especially AlGaInP. Alternatively, if the associated semiconductor region is a phosphide, the etch stop layer is preferably an arsenide, in particular AlGaAs. A thickness of the etch stop layer, which may be doped, is in particular at least 5 nm or 15 nm and/or at most 1 µm or 100 nm or 50 nm.

According to at least one embodiment, the second electrical contact is a metallic contact. This means that the second electrical contact consists of one or more metals. Alternatively, the second electrical contact comprises a transparent conductive oxide, TCO for short, especially directly on the semiconductor layer sequence. Preferably, the second electrical contact is made of gold or a gold alloy, whereby additional metal layers of Pd, Pt, Rh or Ti may be present. The above-mentioned explanations can apply likewise to the first electrical contact.

According to at least one embodiment, an alloying extends from the second electrical contact into the semiconductor layer sequence. The alloying is formed by metals from the associated electrical contact and is produced, for example, by annealing. The alloying process preferably ends at a distance from the active zone. The aforementioned explanations can also apply to the first electrical contact.

According to at least one embodiment, several of the trenches run parallel to each other when viewed from above. The trenches are each provided with the second electrical contact. The second electrical contact preferably forms a self-contained metallic and electrically contiguous region.

An average distance between adjacent trenches is preferably at least 10 µm or 20 µm or 50 µm and/or at most 500 µm or 200 µm or 100 µm or 40 µm.

According to at least one embodiment, the bottom has a width of at least 2 µm or 5 µm. Alternatively or additionally this width is at most 25 µm or 20 µm or 15 µm.

According to at least one embodiment, the depth of the trench is at least 1 µm or 1.5 µm or 2.5 µm. Alternatively or additionally, this depth is at most 8 µm or 6 µm or 4 µm. It is possible that a thickness of the second semiconductor region is at least 2 µm and/or at most 11 µm.

According to at least one embodiment, the electrical transverse conductivity of the second semiconductor region is greater than the electrical transverse conductivity of the first semiconductor region by at least a factor of 2 or 3. The transverse conductivities are preferably specific transverse conductivities, i.e. related to a defined thickness. Alternatively, the first and second semiconductor regions can have similar transverse conductivities.

According to at least one embodiment, the second semiconductor region is free of electrically conductive materials on a side facing away from the active zone, except for the second electrical contact. This means that there are no conductor structures for lateral current spreading on the second semiconductor region, apart from the second electrical contact. In particular, there are no areal electrically conductive layers such as thin, translucent metal layers or layers of a transparent conductive oxide, TCO for short.

According to at least one embodiment, the first and/or the second electrical contact is opaque to the radiation generated during operation. This means that, when the semiconductor chip is operated as intended, the radiation generated cannot penetrate the first and/or second electrical contact.

In the following, an optoelectronic semiconductor chip described here is explained in more detail with reference to the drawing using exemplary embodiments. Like reference signs indicate like elements in the individual figures. However, no scale references are shown; individual elements may be shown in exaggerated size for better understanding.

Figure 1:
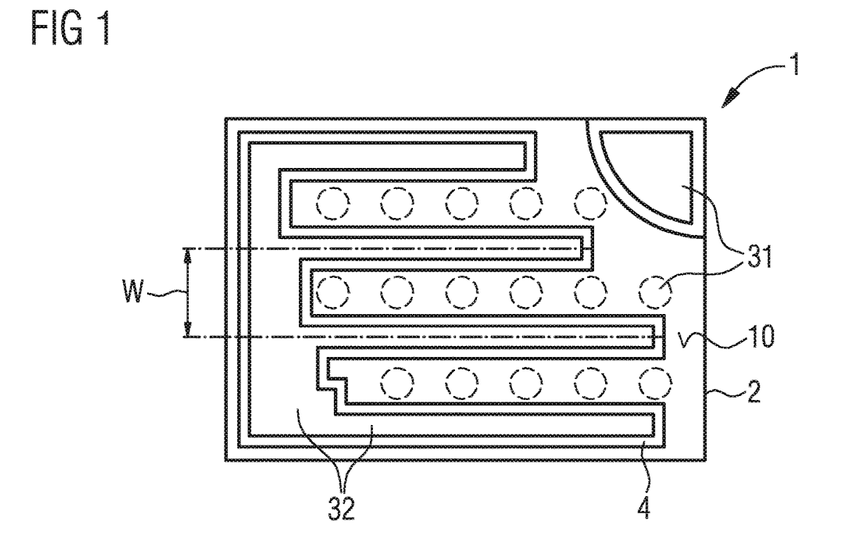
FIG. 1 shows a schematic top view of an exemplary embodiment of an optoelectronic semiconductor chip described here.
Figure 2:
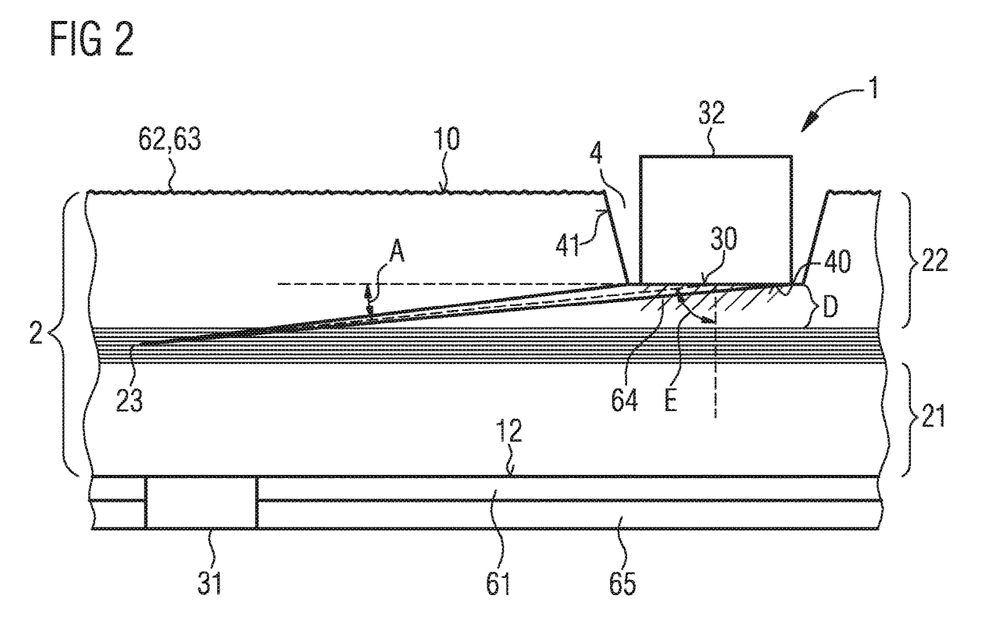
FIG. 2 is a schematic sectional view of an exemplary embodiment of an optoelectronic semiconductor chip described here.

In FIG. 1 a top view of an exemplary embodiment of an optoelectronic semiconductor chip 1 is depicted. A corresponding sectional view is shown in FIG. 2.

The semiconductor chip 1 comprises a semiconductor layer sequence 2. In the semiconductor layer sequence 2 there is a first semiconductor region 21, which is preferably p-doped. Furthermore, semiconductor layer sequence 2 comprises a second semiconductor region 22, which is preferably n-doped. Between the semiconductor regions 21, 22 there is an areal, continuous active zone 23 for radiation generation. The semiconductor layer sequence 2 is based on AlInGaAs for the generation of infrared radiation and on AlGaInP for the generation of red to yellow light. Especially in barrier layers of a quantum well structure, AlGaAsP can also be used, whereby AlGaAs can also be present on a p-conducting side.

An electrical contact of the semiconductor layer sequence 2 is made via a first electrical contact 31 on a back side 12 and via a second electrical contact 32 from an opposite upper side 10. The back side 12 is located at the first semiconductor region 21.

The first region 31 is formed by a large number of preferably point-like regions which are distributed evenly or approximately evenly over the semiconductor layer sequence 2. The first electrical contact 31, for example, is formed by metallic contact points towards the first semiconductor region 21.

The second contact 32, seen in top view, preferably extends in the form of stripes for lateral current distribution across the semiconductor layer sequence 2, for example starting from a corner of the semiconductor layer sequence 2. A distance W from center lines of adjacent stripes is preferably at least 10 µm or 20 µm or 50 µm or 100 µm and/or at most 500 µm or 200 µm or 100 µm or 40 µm. The stripes of the second contact 32, seen in top view, are located especially in the middle between rows of the dot-shaped first contact 31.

The second electrical contact 32 is located in trenches 4, which are formed in the second semiconductor region 22. The trenches 4 are at a distance from the active zone 23. A distance D between a bottom 40 of trench 4 and the active zone 23 is preferably at least 0.5 µm. The second contact 32 preferably extends in several fingers across the semiconductor layer sequence 2. The point-like regions of the first electrical contact 31 are preferably arranged between these fingers or ridges of the second electrical contact 32 when viewed from above. Side walls 41 of the trenches 4 preferably show an obtuse angle towards the bottom 40. In the direction away from the bottom 40, the second electrical contact 32 protrudes over trench 4.

Optionally, starting from the second electrical contact 32 towards the active zone 23, an alloying 64 can be provided. In the area of alloying 64, a material mixture of the semiconductor layer sequence 2 and the metallic second electrical contact 32 is present. A distance between alloying 64 and active zone 23 is preferably at least 200 nm or 100 nm. In FIG. 2, alloying 64 is symbolized by a hatching.

Because the second electrical contact 32 is located in the trenches 4, an underside 30 of the second contact 32 is closer to the active zone 23 than the upper side 10 of the second semiconductor region 22 opposite the back side 12. A center angle A between the underside 30 and the active zone 23 is defined as arctan (2 D/W), i.e. A≈tan A=D/(0.5 W). The center angle A of the underside 30 to the active zone 23 is thus significantly reduced due to the placement of the second contact 32 in the trenches 4. For example, the center angle A is approximately 0.02 rad, for W=100 μm and D=1 μm. Hence, a mean angle of incidence E of radiation generated in the active zone 23 at an interface between the underside 30 and the semiconductor layer sequence 2 is close to 90°, where E=90°−A applies when viewed in cross-section perpendicular to the ridges of the second contact 32. This allows a high reflectivity to be achieved at the underside 30.

Optionally, there is an anti-reflection layer 62 on the upper side 10, e.g. from a λ/4 layer of silicon dioxide, and/or a roughening 63. This allows light extraction efficiency to be increased from the semiconductor layer sequence 2. Such a roughening 63 and/or an anti-reflection layer 62 on the upper side 10 can also be present in all other exemplary embodiments.

Furthermore, a dielectric mirror layer 61 is preferably located on the back side 12. The mirror layer 61 acts in particular via a refractive index difference between the semiconductor layer sequence 2 and a material of the mirror layer 61. A metallic mirror layer 65 is preferably applied to the mirror layer 61 in the direction away from the back side 12. The metallic mirror layer 65 can be composed of several partial layers and serves in particular also for an electrical connection between the individual point-like regions of the first electrical contact 31 on the first semiconductor region 21. The mirror layer 61 can also be composed of several partial layers and is, for example, a Bragg mirror.

It is possible that, seen in top view, contact areas for the first and second electrical contact 31, 32 are provided in corner areas, especially in opposite corner areas. This is illustrated schematically in FIG. 1.

Figure 3:
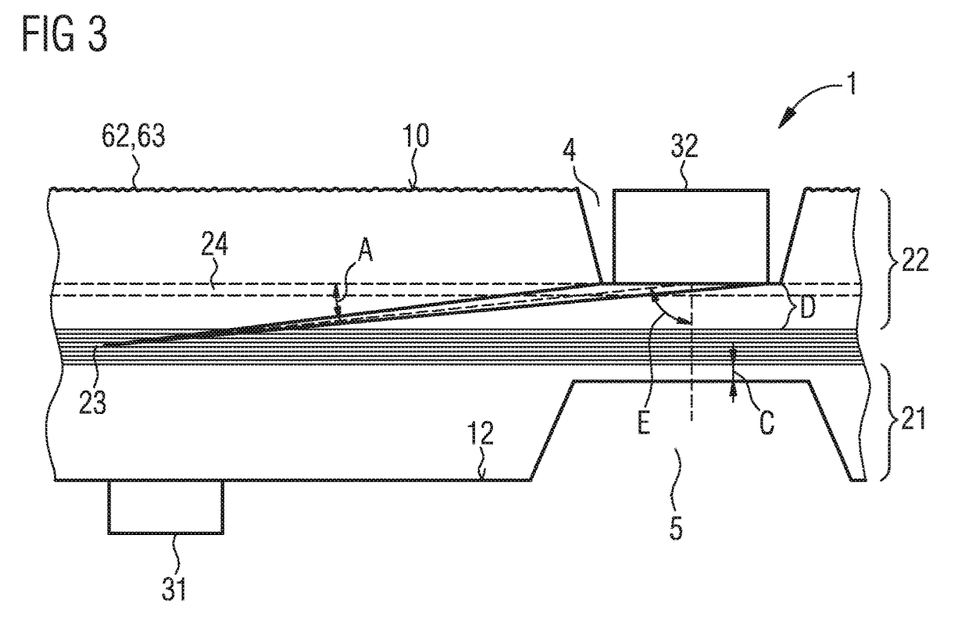
FIG. 3 is a schematic sectional view of an exemplary embodiment of an optoelectronic semiconductor chip described here.

In the exemplary embodiment in FIG. 3 it is shown that a recess 5 in the first semiconductor region 31 is formed opposite the trench 4. Viewed from the back side 12, recess 5 preferably covers trench 4 completely and overhangs trench 4 on both sides, in the direction parallel to active zone 23. A distance C between recess 5 and active zone 23 is preferably about 0.3 μm and is preferably smaller than the distance D between active zone 23 and trench 4. The second contact 32 terminates optionally flush with the upper side 10 in the direction away from active zone 23.

The recess 5 reduces or prevents current flow to active zone 23 in the area of trench 4. This means that no radiation is generated in the active zone 23 immediately below the second contact 32. This reduces the amount of radiation that hits the second contact 32 at small angles of incidence E. Thus absorption losses can be reduced.

Such a recess 5 can also be present in all other exemplary embodiments. In contrast to the drawing, such recesses 5 can also extend next to the stripes of the second contact 32 and form a hexagonal grid when viewed from above.

The trench 4 and optionally also the recess 5 ends at an etch stop layer 24. If the second semiconductor region 22 is for example an arsenide, the etch stop layer 24 is preferably a phosphide. Trench 4 is selectively etched up to the etch stop layer 24, and the etch stop layer 24 is then preferably removed, unlike as shown in FIG. 3. The second contact 32 can then be made directly on the underlying material of the second semiconductor region 22. The etch stop layer 24 can also be made of an arsenide with a high Al content, for example with an Al content of at least 60% or 70% or 80%.

Dielectric and/or metallic mirror layers, as shown in connection with FIG. 2, are preferably also present in the exemplary embodiment of FIG. 3 as well as in all other exemplary embodiments. To simplify the illustration, such layers are not shown in FIG. 3 and the other exemplary embodiments with the recess 5.

Figure 4:
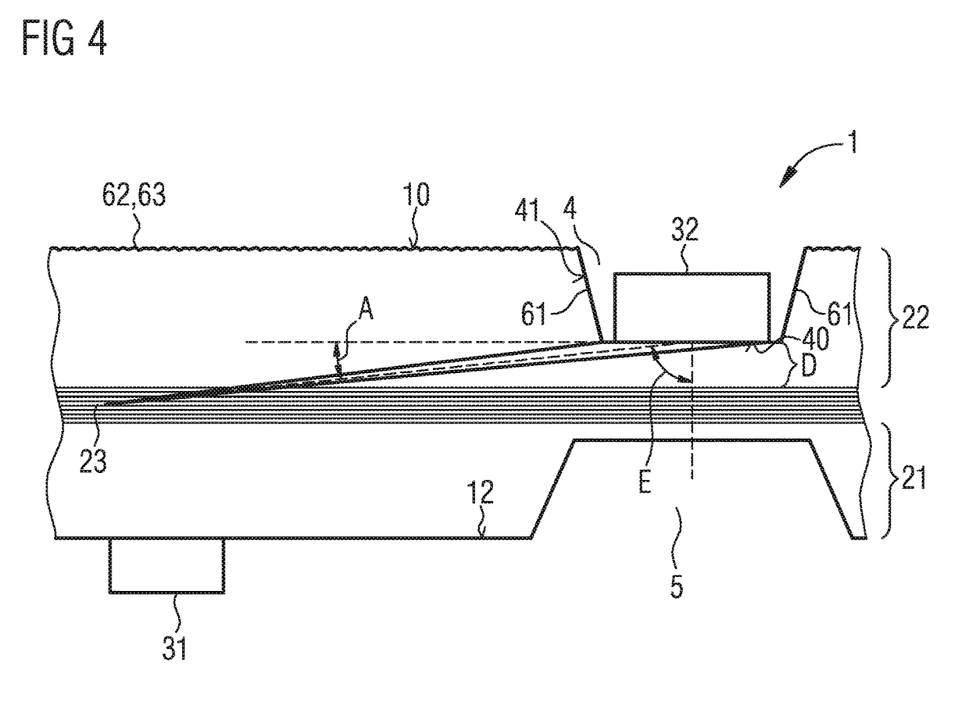
FIG. 4 is a schematic sectional view of an exemplary embodiment of an optoelectronic semiconductor chip described here.

In the exemplary embodiment of FIG. 4, there is a mirror layer 61 on each side wall 41 of the trench 4. This mirror layer 61 is preferably made of an electrically insulating material. A material of the mirror layer 61 is preferably transparent to the radiation generated during operation, so that the mirror layer 61 functions via total reflection and/or interference. The mirror layer 61 can be a layer sequence with several partial layers which have a reflective effect due to their refractive index difference.

Furthermore, FIG. 4 illustrates that the second contact 32, seen in cross-section, lies completely within the trench 4. This applies in particular to the finger-shaped regions of the second contact 32, see FIG. 1. In the area of a bond pad, for example for a bond wire, the second contact 32 can also extend out of the trench 4.

Figure 5:
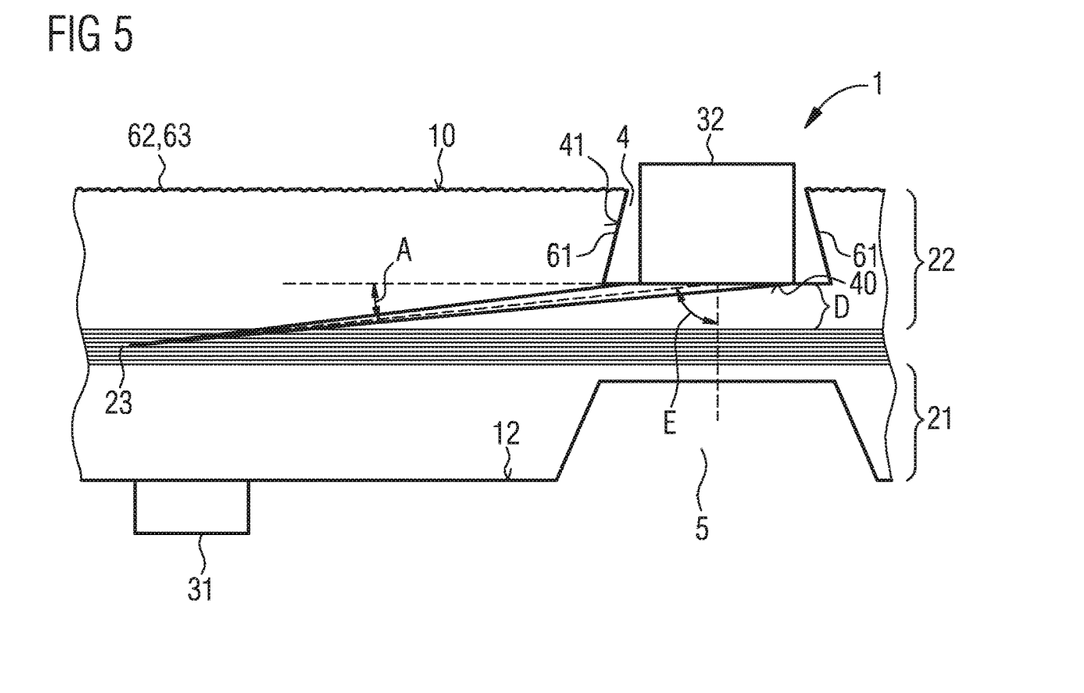
FIG. 5 is a schematic sectional view of an exemplary embodiment of an optoelectronic semiconductor chip described here.

In the exemplary embodiment in FIG. 5, an angle between the bottom 40 and the side walls 41 of trench 4 is an acute angle, for example an angle of about 85°. This makes it possible that radiation impinging on the preferably present mirror layer 61 is reflected towards the upper side 10 and not towards the back side 12. The second contact 32 preferably does not touch the side walls 41.

Figure 6:
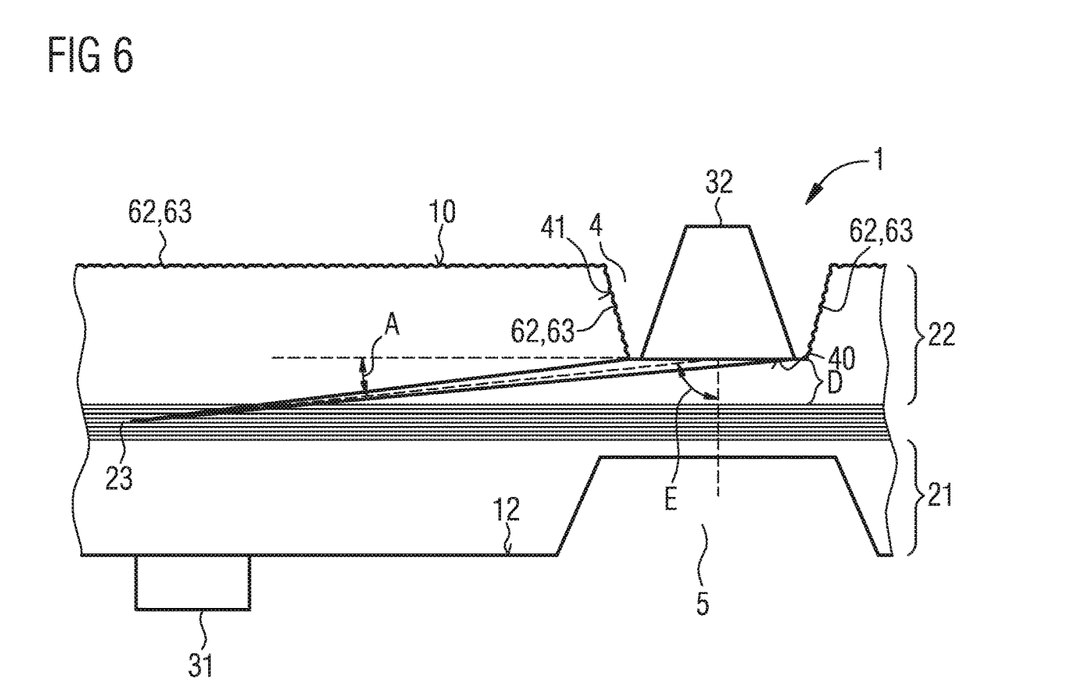
FIG. 6 is a schematic sectional view of an exemplary embodiment of an optoelectronic semiconductor chip described here.

In the exemplary embodiment in FIG. 6, the side walls 41 of trench 4 each have an anti-reflective layer 42 and/or a roughening 63. This allows the anti-reflective layer 62 and/or the roughening 63 to extend from the upper side 10 over the side walls 41 of trench 4 to the bottom 40. The bottom 40 of trench 4 is preferably free of the anti-reflective layer 62 and/or the roughening 63.

In order to prevent absorption on side surfaces of the second contact 32, the second contact 32 is preferably trapezoidal in cross-section, as is also possible in all other exemplary embodiments. Contrary to the illustration in FIG. 6, the second contact 32 can lie completely within the trench 4 when viewed in cross-section, so that the second contact 32 does not protrude beyond the upper side 10, contrary to the illustration in FIG. 6.

Radiation impinging on the side faces of the second contact 32 is reflected in the direction away from the active zone 23 due to the trapezoidal shape of the second contact 32.

Figure 7:
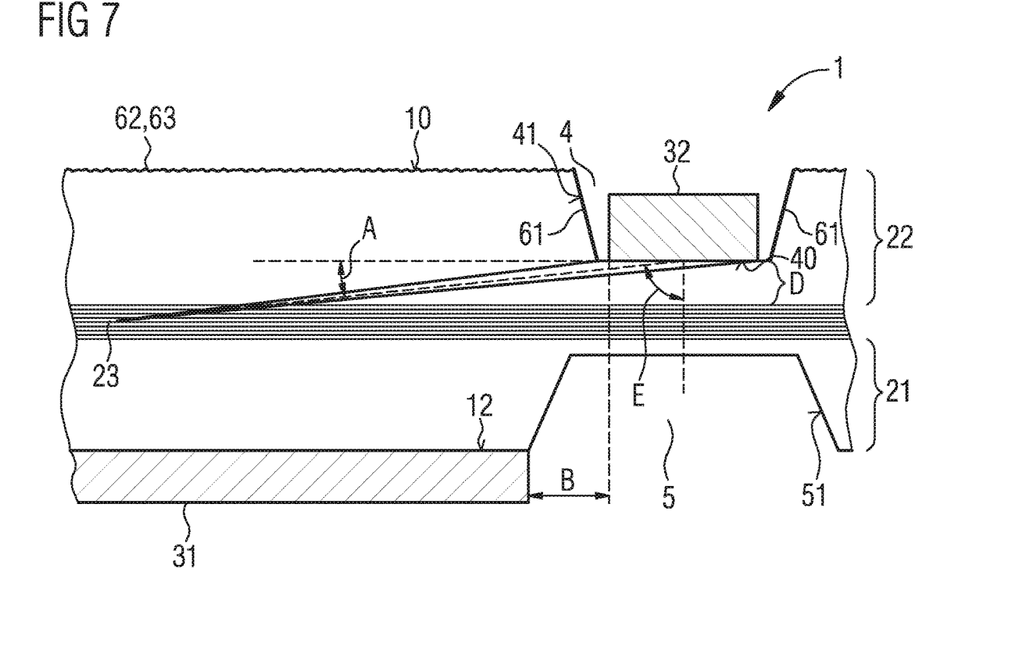
FIG. 7 is a schematic sectional view of an exemplary embodiment of an optoelectronic semiconductor chip described here.
Figure 8:
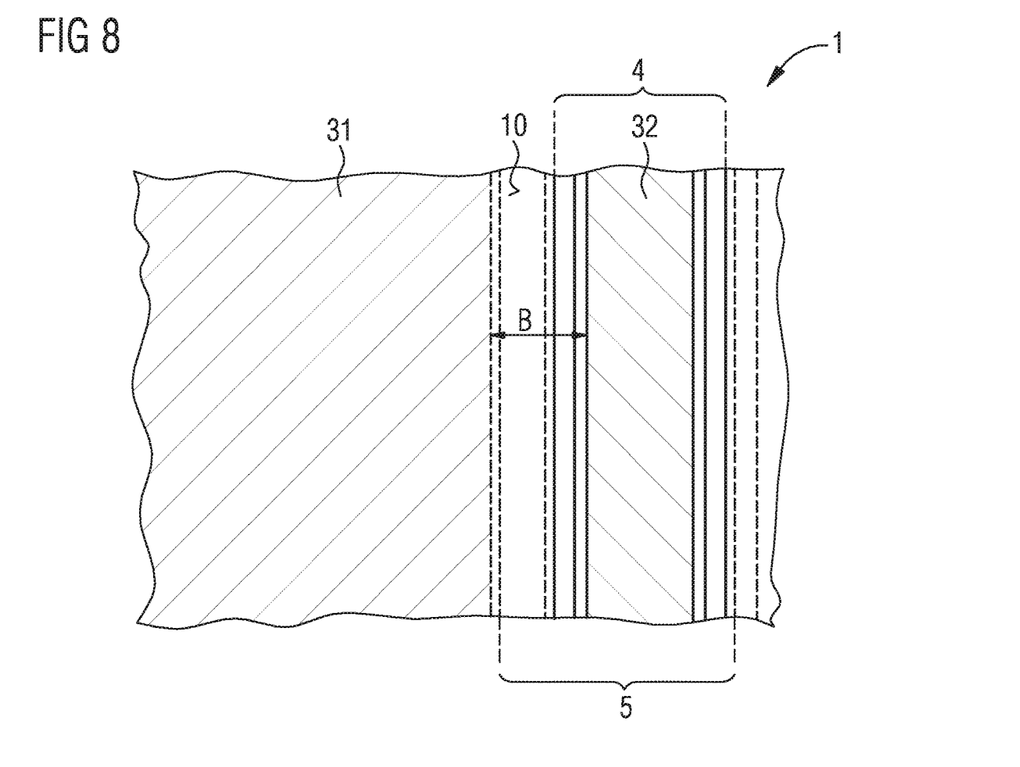
FIG. 8 shows a schematic top view of an exemplary embodiment of an optoelectronic semiconductor chip described here.

The exemplary embodiment in FIG. 7, for example, has a second contact 32 and a recess 5, as explained in connection with FIG. 4. A corresponding top view of the upper side 10 is shown in FIG. 8. In contrast to the illustration in FIG. 4, the first contact 31 covers the first semiconductor region 21. This means that the back side 12 of the second semiconductor region 21 is almost completely covered by the first contact 31, so that the back side 12 is almost completely energized. Such a first contact 31 can also be used in the exemplary embodiments of FIG. 1 to 3, 5 or 6.

Here, in top view of the upper side 10 and of the second semiconductor region 22, the first contact 31 is located exclusively next to the second contact 32. Furthermore, in top view, a lateral distance B between the first and second contacts 31, 32 is at most 50% of the average width of the second contact 32. The first contact 31 preferably does not reach up to a side wall 51 and thus not up to an edge of recess 5 towards the back side 12.

A width of the recess 5 is preferably greater than a width of trench 4, for example by at least a factor of 1.02 or 1.05 and/or by at most a factor of 1.3 or 1.15 greater. Trench 4 can be positioned centrally to recess 5. The first contact 31 is preferably located on both sides of recess 5, which is not shown in FIGS. 7 and 8 for simplification. The same can apply in all other exemplary embodiments.

Unless otherwise indicated, the components shown in the figures preferably follow each other in the order given. Layers not touching each other in the figures are preferably spaced apart. If lines are drawn parallel to each other, the corresponding surfaces are preferably aligned parallel to each other. Likewise, unless otherwise indicated, the relative positions of the drawn components to each other are correctly shown in the figures.

The invention described here is not limited by the description using the exemplary embodiments. Rather, the invention comprises each new feature as well as each combination of features, which in particular includes each combination of features in the claims, even if this feature or combination itself is not explicitly stated in the claims or exemplary embodiments.

LIST OF REFERENCE SIGNS 1 optoelectronic semiconductor chip
10 upper side
12 back side
2 semiconductor layer sequence
21 first semiconductor region (p-doped)
22 second semiconductor region (n-doped)
23 active zone
24 etch stop layer
30 underside of the second contact
31 first electrical contact
32 second electrical contact
4 trench in the second semiconductor region
40 bottom of the trench
41 side wall of the trench
5 recess in the first semiconductor region
51 side wall of the recess
61 dielectric mirror layer
62 anti-reflection coating
63 roughening
64 alloying
65 metallic mirror coating
A center angle second contact—active zone
B distance first contact—second contact
C distance recess—active zone
D distance trench—active zone
E angle of incidence
W distance between adjacent second contacts

The invention claimed is:

1. An optoelectronic semiconductor chip comprising:
a semiconductor layer sequence in which an active zone for generating radiation is located between a first semiconductor region and a second semiconductor region,
a first electrical contact of the semiconductor layer sequence at the first semiconductor region, and
a second electrical contact of the semiconductor layer sequence at the second semiconductor region,
where
the second electrical contact is at least partially located in a trench of the second semiconductor region and touches the second semiconductor region in the trench,
a radiation is coupled out from the semiconductor layer sequence at least predominantly at the second semiconductor region, and
the trench is restricted to the second semiconductor region and terminates at a distance from the active zone, so that a distance (D) between a bottom of the trench and the active zone is at most 3 µm and, in addition, at least one of the following two possibilities is fulfilled, according to which:
at least one recess is formed in the first semiconductor region, so that the first semiconductor region is partially removed and the recess is spaced from the active zone and is opposite the trench, so that, seen in top view, the recess and the trench overlap one another and so that the recess (5) reduces or prevents the active zone in the region of the trench from being supplied with current from the first semiconductor region, and/or
the first contact covers the first semiconductor region in an areal manner, so that the first contact lies exclusively next to the second contact when the second semiconductor region is viewed in a top view, and a distance between the first and second contacting is at most 50% of an average width of the second contacting when viewed in a top view.

2. The optoelectronic semiconductor chip according to claim 1,
in which side walls of the trench are free of the second electrical contact,
wherein a center angle (A) between an underside of the second electrical contact and a radiation generating portion of the active zone is between 1 mrad and 80 mrad inclusive.

3. The optoelectronic semiconductor chip according to claim 1,
in which the second electrical contact, as viewed in at least one cross-section perpendicular to the trench, lies completely in the associated trench,
wherein a ratio of a length of the second electrical contact and a width of the second electrical contact is at least 15 when viewed in top view.

4. The optoelectronic semiconductor chip according to claim 1,
in which the second electrical contact projects beyond the associated trench in a direction away from the bottom as viewed in at least one cross-section perpendicular to the trench,
wherein the bottom is predominantly directly covered by the second electrical contact.

5. The optoelectronic semiconductor chip according to claim 1,
in which the recess is wider than the associated trench, projects beyond the trench on both sides as seen in cross-section and reaches closer to the active zone than the trench.

6. The optoelectronic semiconductor chip according to claim 1,
in which the side walls of the trench are at least partially provided with a mirror layer,
wherein the mirror layer is electrically insulating and covers the bottom of the trench to a maximum of 40%.

7. The optoelectronic semiconductor chip according to claim 1,
in which the side walls of the trench are at least partially provided with an anti-reflection layer and/or with a roughening,
wherein the bottom of the trench is free of the anti-reflection layer and/or the roughening.

8. The optoelectronic semiconductor chip according to claim 1,
in which the side walls of the trench are inclined inwards, so that in top view the bottom of the trench is partially covered by the side walls.

9. The optoelectronic semiconductor chip according to claim 1,
in which the second electrical contact is trapezoidal when viewed in cross-section, so that a width of the second electrical contact continuously decreases in the direction away from the bottom of the trench.

10. The optoelectronic semiconductor chip according to claim 1,
in which the second electrical contact is configured for current distribution in a direction parallel to the active zone, so that, seen in top view, a branched structure is formed across the semiconductor layer sequence by the second electrical contact,
wherein the first electrical contact is formed with a plurality of point-like current supply regions to the first semiconductor region, so that the first electrical contact contacts the first semiconductor region only to an area proportion of at most 40%.

11. The optoelectronic semiconductor chip according to claim 1,
in which the active zone extends continuously over the semiconductor layer sequence, so that the active zone runs continuously under the at least one trench.

12. The optoelectronic semiconductor chip according to claim 1,
in which the second semiconductor region comprises an etch stop layer and the trench terminates at or below the etch stop layer,
wherein either the etch stop layer is of a phosphide and the second semiconductor region is of an arsenide or an arsenide having a high aluminum content, or the etch stop layer is of an arsenide and the second semiconductor region is of a phosphide.

13. The optoelectronic semiconductor chip according to claim 1,
in which the second electrical contact is a metallic contact and consists of one or more metals,
wherein, starting from the second electrical contact, alloying is carried out into the semiconductor layer sequence, and
wherein the alloying terminates spaced from the active zone.

14. The optoelectronic semiconductor chip according to claim 1,
in which a plurality of the trenches run parallel to one another and the trenches are each provided with the second electrical contact,
where, viewed in top view, the average distance between adjacent trenches is between 30 µm and 200 µm inclusive.

15. The optoelectronic semiconductor chip according to claim 1,
in which the bottom has a width between 2 µm and 20 µm inclusive and in which at least one trench has a depth between 1.5 µm and 8 µm inclusive,
wherein a thickness of the second semiconductor region is between 2 µm and 11 µm inclusive, and
wherein the semiconductor layer sequence is based on the material system AlInGaAsP.

16. The optoelectronic semiconductor chip according to claim 1,
in which the second semiconductor region on an upper side facing away from the active zone is free, apart from the second electrical contact, from electrically conductive materials such as transparent conductive oxides or radiation-transmitting metal layers,
wherein the first semiconductor region is p-doped and the second semiconductor region (22) is n-doped.

17. An optoelectronic semiconductor chip comprising:
a semiconductor layer sequence in which an active zone for generating radiation is located between a first semiconductor region and a second semiconductor region,
a first electrical contact of the semiconductor layer sequence at the first semiconductor region, and
a second electrical contact of the semiconductor layer sequence at the second semiconductor region,
wherein
the second electrical contact is at least partially located in a trench of the second semiconductor region and touches the second semiconductor region in the trench, wherein side walls of the trench are free from the second electrical contact,
a radiation is coupled out from the semiconductor layer sequence at least predominantly at the second semiconductor region, and
the trench is restricted to the second semiconductor region and terminates at a distance from the active zone, so that a distance (D) between a bottom of the trench and the active zone is at most 3 µm and, in addition, at least one of the following two possibilities is fulfilled, according to which:
at least one recess is formed in the first semiconductor region, so that the first semiconductor region is partially removed and the recess is spaced from the active zone and is opposite the trench, so that, seen in top view, the recess and the trench overlap one another and so that the recess reduces or prevents the active zone in the region of the trench from being supplied with current from the first semiconductor region, and/or
the first contact covers the first semiconductor region in an areal manner, so that the first contact lies exclusively next to the second contact when the second semiconductor region is viewed in a top view, and a distance between the first and second contacting is at most 50% of an average width of the second contacting when viewed in a top view.

* * * * *

UNITED STATES PATENT AND TRADEMARK OFFICE
CERTIFICATE OF CORRECTION

PATENT NO. : 11,374,152 B2
APPLICATION NO. : 17/054488
DATED : June 28, 2022
INVENTOR(S) : Stefan Heckelmann et al.

It is certified that error appears in the above-identified patent and that said Letters Patent is hereby corrected as shown below:

In the Claims

Claim 1, at Column 12, Line numbered 19, after "distance", delete "(D)".

Claim 1, at Column 12, Line numbered 28, after "recess", delete "(5)".

Claim 2, at Column 12, Line numbered 42, after "angle", delete "(A)".

Claim 16, at Column 14, Line numbered 25, after "region", delete "(22)".

Claim 17, at Column 14, Line numbered 45, after "distance", delete "(D)".

Signed and Sealed this
Twenty-fifth Day of October, 2022

*Katherine Kelly Vidal*

Katherine Kelly Vidal
*Director of the United States Patent and Trademark Office*